(12) United States Patent
Lorca Hernando (10) Patent No.: US 10,003,435 B2
(45) Date of Patent: Jun. 19, 2018

(54) METHOD, SYSTEM AND DEVICE FOR ERROR DETECTION IN OFDM WIRELESS COMMUNICATION NETWORKS WITHOUT FULL FORWARD ERROR CORRECTION DECODING

(71) Applicant: TELEFONICA, S.A., Madrid (ES)

(72) Inventor: Javier Lorca Hernando, Madrid (ES)

(73) Assignee: TELEFONICA, S.A., Madrid (ES)

( * ) Notice: Subject to any disclaimer, the term of this patent is extended or adjusted under 35 U.S.C. 154(b) by 60 days.

(21) Appl. No.: 15/361,160

(22) Filed: Nov. 25, 2016

(65) Prior Publication Data

US 2017/0149529 A1   May 25, 2017

(30) Foreign Application Priority Data

Nov. 25, 2015   (EP) .................................... 15382587

(51) Int. Cl.
| | | |
|---|---|---|
| H04W 4/00 | (2018.01) | |
| H04L 1/00 | (2006.01) | |
| H04L 5/00 | (2006.01) | |
| H04L 29/06 | (2006.01) | |
| H03M 13/29 | (2006.01) | |
| H03M 13/37 | (2006.01) | |
| H03M 13/00 | (2006.01) | |
| H04L 1/20 | (2006.01) | |
| H03M 13/11 | (2006.01) | |

(52) U.S. Cl.
CPC ...... *H04L 1/0042* (2013.01); *H03M 13/2948* (2013.01); *H03M 13/3738* (2013.01); *H03M 13/3753* (2013.01); *H03M 13/612* (2013.01); *H04L 1/005* (2013.01); *H04L 1/201* (2013.01); *H04L 5/0007* (2013.01); *H04L 69/22* (2013.01); *H03M 13/1128* (2013.01); *H03M 13/2957* (2013.01)

(58) Field of Classification Search
None
See application file for complete search history.

(56) References Cited

U.S. PATENT DOCUMENTS

| 2016/0072657 A1* | 3/2016 | Vojcic ..................... H04L 1/005 |
| | | 375/260 |
| 2016/0352463 A1* | 12/2016 | Vojcic ..................... H04L 1/005 |

OTHER PUBLICATIONS

K. Xie et al., "A New ARQ Method for Turbo Coded MC-CDMA," Communications, 2005, vol. 5, May 16, 2005, pp. 3417-3421.
European Search Report, 7 pgs, Jun. 1, 2016.
Kai Xie et al., "A new ARQ method for turbo coded MC-CDMA", Communications, 2005. ICC 2005. 2005 IEEE International Conference on Seoul, Korea May 16-20, 2005, Piscataway, NJ, USA, IEEE vol. 5, May 16, 2005, pp. 3417-3421.

* cited by examiner

*Primary Examiner* — Phirin Sam
(74) *Attorney, Agent, or Firm* — McNees Wallace & Nurick LLC (57) ABSTRACT

A system, method and device for error detection/estimation in OFDM communications systems is proposed. The disclosed mechanism allows an efficient error prediction in a received packet, without having to perform full FEC decoding of the packet that could impair the overall latency of the system due to the time spent in a complete FEC decoding of the packet. In order to do that, it generates a decision variable with the aim to check whether a received packet has errors or not, after performing only partial FEC decoding of the packet, without either resorting to the use of error-detection codes.

15 Claims, 3 Drawing Sheets

METHOD, SYSTEM AND DEVICE FOR ERROR DETECTION IN OFDM WIRELESS COMMUNICATION NETWORKS WITHOUT FULL FORWARD ERROR CORRECTION DECODING

FIELD OF THE INVENTION

The present invention has its application within the telecommunication sector, especially, deals with the field of error detection in Orthogonal Frequency-Division Multiple Access (OFDMA) wireless communication systems. More specifically, the present invention proposes a method, a system and a device to detect (predict or estimate) errors in a received block (e.g. a packet) in Orthogonal Frequency-Division Multiplexing (OFDM) networks (e.g., in Long-Term Evolution, LTE, networks) without using error detection codes and without performing full Forward Error Correction decoding of the packet at the receiver.

BACKGROUND OF THE INVENTION

LTE (Long Term Evolution) is the next step in cellular Third-Generation (3G) systems, which represents basically an evolution of previous mobile communications standards such as Universal Mobile Telecommunication System (UMTS) and Global System for Mobile Communications (GSM). It is a Third Generation Partnership Project (3GPP) standard that provides throughputs up to 50 Mbps in uplink and up to 100 Mbps in downlink. It uses scalable bandwidth from 1.4 to 20 MHz in order to suit the needs of network operators that have different bandwidth allocations. LTE is also expected to improve spectral efficiency in networks, allowing carriers to provide more data and voice services over a given bandwidth. In order to do that, LTE uses Orthogonal Frequency-Division Multiple Access (OFDMA) which is a proven access technique, based on Orthogonal Frequency-Division Multiplexing (OFDM), for efficient user and data multiplexing in the frequency domain. Other wireless standards like WiFi (IEEE 802.11) or WiMAX (IEEE 802.16) also employ OFDM techniques.

One of the advantages of OFDM is its ability to resolve the frequency components of the received signal. Frequency resolution allows the receiver to determine the received signal to interference and noise ratio (SINR) corresponding to the different frequencies of interest or subcarriers. This set of SINR values is exploited by the receiver to derive the most suitable modulation and coding format to use when link adaptation is employed in the system. The receiver can obtain such modulation and coding format, and report it to the transmitter in order to optimize the transmissions for the most suitable operating point.

On the other hand, error detection and correction in received blocks (for example in the received packets) are long-standing techniques that have achieved stunning progress in the last decades. Error detection codes have the ability to detect that an error has occurred in a packet with high reliability, at the cost of some overhead usually appended at the end of the packet. Forward Error Correction (FEC) techniques encoding/decoding techniques are able to correct bit errors up to a certain limit depending on the channel and the characteristics of the underlying FEC code. While the FEC encoding process at the transmitter is computationally quite simple, FEC decoding at the receiver can be extremely time-consuming, for example, for state-of-the-art FEC techniques like turbo coding or Low-Density Parity Check (LDPC) coding. This computational burden introduces significant penalty in the overall latency of the system, which in turn constrains the maximum length of the transport network links, especially in so-called centralized or Cloud radio access networks (CRAN), between remote radio heads and the baseband unit. Said transport network, commonly known as fronthaul, is mainly constrained by the Hybrid Automatic Repeat Request Round-Trip-Time (HARQ RTT), which in LTE is equal to 8 ms. A significant proportion of the time budget for reception is spent on the FEC decoding process, thus imposing a maximum length for the fronthaul links.

Detecting (or predicting) errors in a received block prior to actually decoding it can be very advantageous for significantly reducing the overall latency at the radio access network. Early detection of packet errors can trigger retransmissions without having to perform complete FEC decoding of the packet. Moreover, in fully or partly centralized RAN architectures where FEC decoding is centralized, early triggering of retransmissions at the remote radio head can relax the time budget constraints for the fronthaul network by taking the FEC decoding process out of the critical HARQ loop.

There are partial solutions for time budget relaxation at the fronthaul network involving, for example, splitting the Medium Access Control (MAC) layer for early triggering of HARQ retransmissions. However these solutions do not perform early detection of packet errors, and instead both acknowledgments (ACK) and non-acknowledgments (NACK) are pre-processed at the remote radio head. This imposes limitations in terms of lack of flexibility to allocate different resources for a transmission and a retransmission.

More adequate solutions are therefore required in order to predict whether an error has occurred in a given received packet with sufficient reliability, without having to perform full FEC decoding of the packet (which involves significant penalty in terms of the overall latency of the system).

SUMMARY OF THE INVENTION

The present invention solves the aforementioned problems and overcomes previously explained state-of-the-art limitations by determining whether a received block (e.g. a packet) has errors or not in a communication system employing OFDM, without having to perform full FEC decoding of the receving block. The invention exploits the procedure proposed in European Patent Application EP15382344 (by the same inventor and applicant as the present application) for detection of packet errors without error detection coding, with the necessary changes at the receiver, required for early detection of packet errors, according to the principles described in this invention. Prior art OFDM transmitters can be used in the present invention without any change.

The transmitter in OFDM communications systems, according to prior art techniques, performs FEC encoding at the intended coding rate after receiving from upper layers an information packet to be sent to the receiver, followed by suitable modulation and mapping onto OFDM physical resources, as well as any other processing steps as required in prior art OFDM communications systems.

After suffering a number of channel impairments, the signal corresponding to the information packet will arrive at the receiver. The aim of the present invention is to avoid full FEC decoding of the packet, while still retaining its basic characteristics so as to provide a suitable estimation of the presence of errors in the packet. In what follows, a FEC encoding mechanism will be assumed such that the decoding process comprises a number of successive iterations. Examples of such encoding mechanisms can be turbo encoding and LDPC encoding, among other possibilities.

In order to estimate the presence of packet errors, among other tasks, the receiver performs a limited number of FEC decoding iterations on the received packet, such number of iterations being lower than the number of iterations ideally required for reliable recovery of the packet at the intended signal to noise and interference ratio (SINR). The actual number of iterations performed in the present invention, can be chosen as a trade-off between accuracy in the estimation of packet errors and overall decoding delay. After the iterations, Log-Likelihood Ratio (LLR) values of the intermediately decoded bits will be obtained, characterizing the intermediate steps towards full decoding. With these LLR values, and according to the procedure described in EP15382344, the receiver can obtain the actual block error probability (BLEP) and the probability density function of the BLEP corresponding to said decoding iteration. Additionally, the block error rate (BLER) that would correspond to full decoding can also be obtained, by means of link-to-system mapping between the post-detection SINR and the actual BLER. With this information, it is possible to obtain a decision variable to check whether the packet is considered to have errors or not, without full FEC decoding.

Hence, the described procedure ideally involves a lower number of decoding iterations compared to what would be required for full FEC decoding. Avoiding full FEC decoding can be beneficial to relax the time budget allowed for packet processing, which is advantageous in centralized RAN deployments where stringent latency limits have to be met at the radio access part, or when a maximum Hybrid Automatic Repeat Request Round Trip Time (HARQ RTT) is set for HARQ operation.

According to a first aspect, the present invention proposes a method for detecting errors in an information (data) packet (13), or generally speaking an information block (sent by an OFDM transmitter), received by an OFDM receiver (14) in an Orthogonal Frequency-Division Multiplexing, OFDM, system, where the information packet is encoded using a Forward Error Correction, FEC, technique, and the received packet contains $N_{FEC}$ bits, said FEC technique involves that the receiver performs an iterative process for decoding, the method characterized by comprising the following steps performed at the receiver (14):

a) performing a number of iterations, $N_{iter}$, of the Forward Error Correction decoding technique on the received packet (where $N_{iter}$ is lower than the minimum number of iterations required for full FEC decoding at the intended signal to noise and interference ratio, SINR);
b) obtaining (calculating) a posteriori log-likelihood ratio, LLR, value for each decoded bit after $N_{iter}$ FEC decoding iterations;
c) obtaining the block error probability for the block of decoded bits after $N_{iter}$ iterations, $BLEP_0^{Niter}$, and the probability density function of said block error probability, from said a posteriori LLR values;
d) estimating a block error rate (that would correspond to the received packet under full FEC decoding), based on post-detection Signal to Interference and Noise Ratios, SINR, of the received bits;
e) obtaining a decision variable value for block error decisions, Z, as a function of the obtained block error probability $BLEP_0^{Niter}$ and the probability density function of said block error probability; and
f) determining whether the received packet has errors or not, by comparing said decision variable with a first threshold.

The network may be a Long-Term Evolution, LTE, wireless cellular system or an IEEE 802.11, WiFi, system or an IEEE 802.16, WiMAX, system, or any other type of communications network using OFDM.

The LLR values for the decoded bits after $N_{iter}$ FEC decoding iterations may be obtained as:

$$LLR_n^{Niter} \equiv \ln\frac{p(x_n = +1 \mid y)}{p(x_n = -1 \mid y)}, n = 0, \ldots, N-1,$$

where $LLR_n^{Niter}$ denotes the a-posteriori log-likelihood ratio of the received n-th bit after $N_{iter}$ iterations, y denotes the decoded signal after $N_{iter}$ iterations, $x_n$ is the corresponding n-th transmitted bit, and N is the number of bits of the block before the FEC encoding, that is, $N = r \cdot N_{FEC}$, where r is the FEC encoding rate of the FEC technique used for encoding the block.

The block error probability after $N_{iter}$ iterations, $BLEP_0^{Niter}$, may be obtained by the expression:

$$BLEP_0^{Niter} = 1 - \prod_{n=0}^{N-1}\left(\frac{1}{1 + e^{-|LLR_n^{Niter}|}}\right),$$

where $LLR_n^{Niter}$ is the log-likelihood ratio of the received n-th bit after $N_{iter}$ iterations.

The probability density function of said block error probability after $N_{iter}$ iterations, $BLEP^{Niter}$ may be calculated as a function of the probability density function of the LLR values, $LLR_n^{Niter}$, by using the following transformation:

$$\ln(1 - BLEP^{Niter}) = -\sum_{n=0}^{N-1}\ln\left(1 + e^{-|LLR_n^{Niter}|}\right).$$

The information packet may be received in a communications signal through a communication channel.

The average block error rate that would correspond to the received packet under full FEC decoding may be estimated following these steps:
- obtaining post-detection Signal to Interference and Noise Ratio, SINR, values characterizing the received signal prior to FEC decoding;
- from said post-detection SINR values, calculating an effective SINR by means of a Link to System technique; and
- calculating the average block error rate that would be obtained if the communication channel would have been an Additive White Gaussian Noise Channel for the effective SINR value calculated.

The decision variable may be the probability that the block error probability after $N_{iter}$ iterations is higher than $BLEP_0^{Niter}$. The first threshold may be the estimated block error rate.

The decision variable Z may be calculated as:

$$Z = \int_{BLEP_0^{Niter}}^{1} f_{BLEP^{Niter}}(BLEP^{Niter})\, dBLEP^{Niter},$$

where $f_{BLEP^{Niter}}$ denotes the probability density function of $BLEP^{Niter}$ obtained as a transformation of the a posteriori LLR values, and $BLEP_0^{Niter}$ is the block error probability of the received packet after $N_{iter}$ iterations.

The method may further comprise calculating the reliability in said estimation of block errors as a log-likelihood ratio value, $LLR_z$, obtained as the logarithm of the ratio between the decision variable and the block error rate. Usually, uncertainty regions are defined for $LLR_z$, in such a way that the percentages of erroneous decisions are kept below given targets if error decisions are made only when $LLR_z$ values fall outside said uncertainty region.

Statistics of the LLR values (to obtain the pdf) for the decoded bits after $N_{iter}$ FEC decoding iterations may be inferred by obtaining the histogram of LLR values corresponding to the received packet, provided that the channel coherence bandwidth is much larger than the bandwidth occupied by the signal or may be previously stored at the receiver as a function of the received SINR value, in Additive White Gaussian Noise conditions, provided that the channel coherence bandwidth is much larger than the bandwidth occupied by the signal.

The number of decoding iterations $N_{iter}$ may be selected as a trade-off between latency of the decoding process and accuracy of block error decisions in the operating BLER range.

Another aspect of the present invention refers to an OFDM receiver for implementing the method described above at the receiver side. That is, an n OFDM receiver (14) for detecting errors in an information packet (block) received through a communication channel (12) of an OFDM network, where the information packet is encoded using a Forward Error Correction, FEC, technique, said FEC technique involving, for decoding at the receiver, an iterative decoding process, the receiver (14) comprising:

A decoder for performing a number of iterations, $N_{iter}$, of a Forward Error Correction decoding technique on the received packet of length $N_{FEC}$ bits, where $N_{iter}$ is lower than the minimum number of iterations required for full FEC decoding at the intended signal to noise and interference ratio, SINR;

Means for:
  Obtaining a posteriori log-likelihood ratio, LLR, values for each decoded bit after $N_{iter}$ FEC decoding iterations;
  Obtaining the block error probability for the block of decoded bits after $N_{iter}$ iterations, $BLEP_0^{Niter}$ and the probability density function of said block error probability, from said a posteriori LLR values;
  Estimating a block error rate that would correspond to the received block under full FEC decoding, based on post-detection Signal to Interference and Noise Ratios, SINR, of the received bits;
  Obtaining a decision variable value for block error decisions, Z, as a function of the block error probability $BLEP_0^{Niter}$ and the probability density function of said block error probability; and
  Determining whether the packet that would result after full FEC decoding has bit errors or not, by comparing said decision variable with a first threshold.

In another aspect of the present invention, it is provided a system which comprises an OFDM transmitter and at least one OFDM receiver (as defined before) connected to the OFDM transmitter via a wired or wireless interface (e.g. a LTE network).

In a last aspect of the present invention, a computer program is disclosed, comprising computer program code means adapted to perform the steps of the described method, when said program is run on processing means of a network entity of an OFDMA network, said processing means being for example a computer, a digital signal processor, a field-programmable gate array (FPGA), an application-specific integrated circuit (ASIC), a micro-processor, a micro-controller, or any other form of programmable hardware. In other words, a computer program comprising instructions, causing a computer executing the program to perform all steps of the described method, when the program is run on a computer. A digital data storage medium is also provided for storing a computer program comprising instructions, causing a computer executing the program to perform all steps of the disclosed methods when the program is run on a computer.

Consequently, according to the invention, a method, system, device and storage medium according to the independent claims are provided. Favourable embodiments are defined in the dependent claims.

These and other aspects and advantages of the invention will be apparent from and elucidated with reference to the embodiments described hereinafter.

DESCRIPTION OF THE DRAWINGS

For the purpose of aiding the understanding of the characteristics of the invention, according to a preferred practical embodiment thereof and in order to complement this description, the following figures are attached as an integral part thereof, having an illustrative and non-limiting character.

DETAILED DESCRIPTION OF THE INVENTION

The proposed invention provides a method, system and device for error determination (inferring whether a block is received with errors) in OFDMA communication systems (or more generically in OFDM communications systems) as for example LTE networks or any other type of OFDM networks. The proposed mechanism allows an efficient error prediction in a received data block (e.g. a packet) without having to perform full FEC decoding of the packet in OFDM communication systems.

Figure 1:
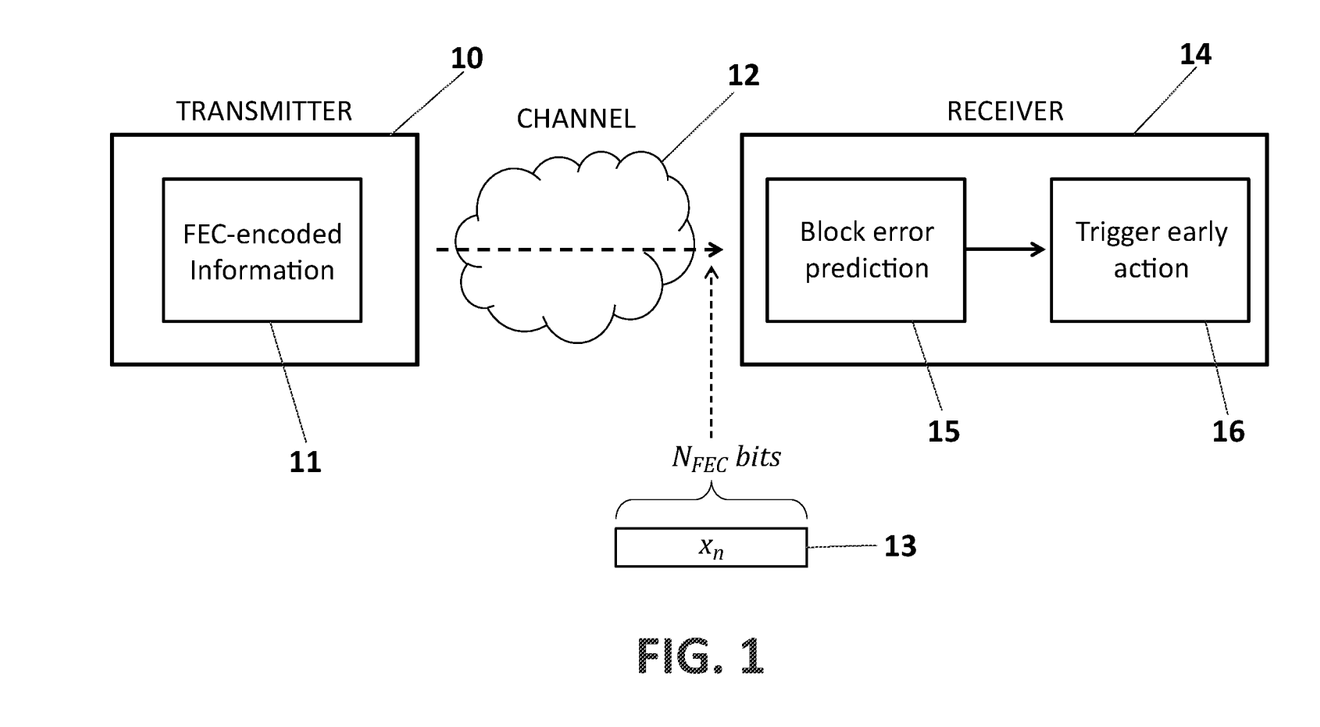
FIG. 1 shows a schematic block diagram of a network scenario for a possible application case according to an embodiment of the invention.

FIG. 1 depicts a schematic block diagram of a network scenario for a possible application case according to an embodiment of the invention. In FIG. 1, there is a transmitter (10) (for example, an OFDM transmitter, that is, a transmitter able to transmit signals using an OFDM technique), a receiver (14) (for example, an OFDM receiver, that is, a receiver able to receive signals transmitted using an OFDM technique) and a communication channel (12), either wireless or wireline, which connects said transmitter with said receiver (that is, the transmitter sends the signals to the receiver through the communication channel).

In an embodiment, the transmitter (10) sends a FEC-encoded block of information (11) (information packet) of $N_{FEC}$ bits (13), which represents the information (11) to be conveyed to the receiver. The block is sent through the channel (12) which can be either wireless or wireline, and arrives at the receiver (14). The receiver (14) is faced to the problem of how to detect (15) whether the packet (13) is received with errors or not without performing full FEC decoding of the packet, in order to trigger early actions related to the presence of errors (e.g. a MAC-level retransmission) (16). In what follows the terms "FEC encoding" and "FEC decoding" will refer to any suitable forward error correction scheme applied at transmission and reception of the packet, respectively.

Moreover, in what follows only FEC schemes will be considered such that FEC decoding involves an iterative procedure (also called message-passing or belief propagation algorithms). Examples of such schemes are turbo codes and LDPC codes, not precluding other FEC mechanisms following the same decoding approach.

The present invention comprises changes in OFDM reception of FEC-encoded information packets, as explained in the following subsections, while keeping prior art OFDM transmission and encoding processes unchanged.

Figure 2:
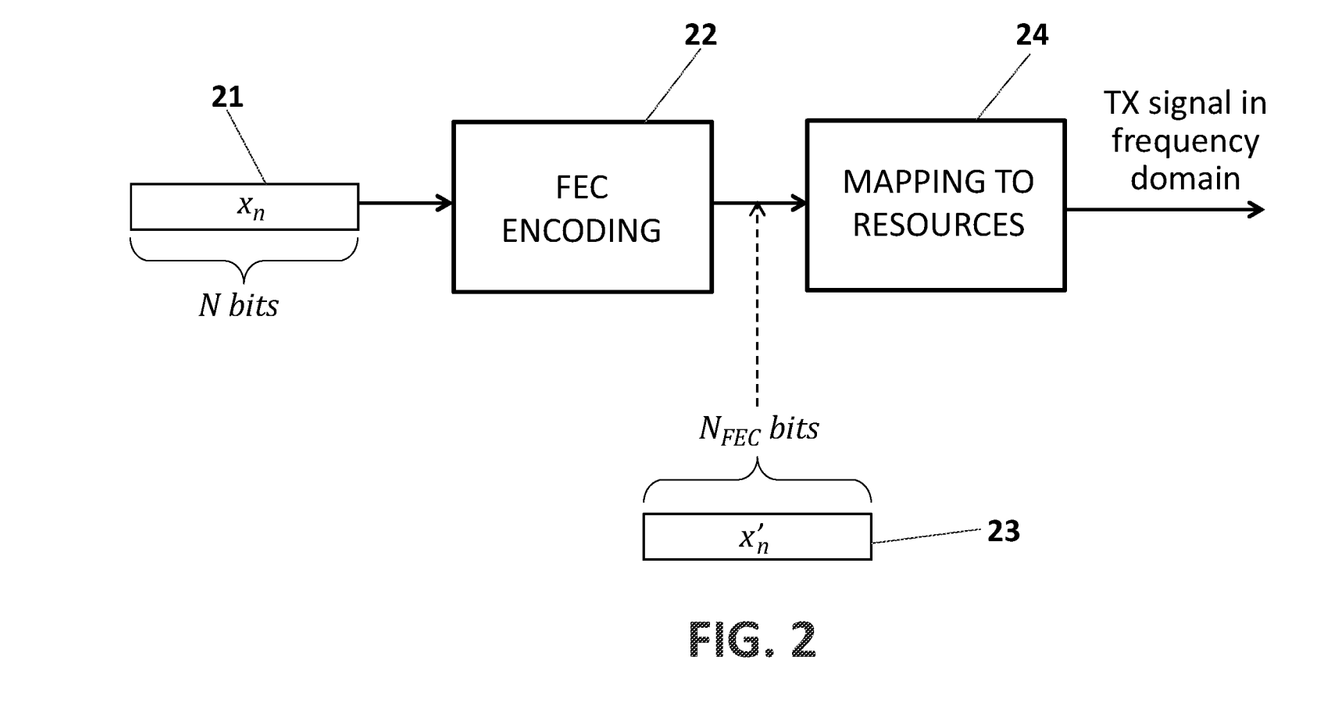
FIG. 2 shows a schematic block diagram of an OFDM transmitter.

In prior art, as FIG. 2 illustrates at the transmitter side of a FEC-aided OFDM communication system, an information block of size N bits (21) is FEC encoded (22) resulting in an encoded block (packet) of size $N_{FEC}$ bits (23), which is further mapped to physical resources (24) (e.g. time, frequency) to yield the transmission signal in the frequency domain. It can be written that $N = r \cdot N_{FEC}$, where r is the FEC encoding rate.

The encoded packet, after being sent to the receiver, will suffer from channel impairments such as additive noise, fast fading, slow fading (shadowing), and interference, among others. The objective of the present invention is to predict (determine) whether the packet is received with errors without having to perform full FEC decoding of the whole packet.

To that end, the receiver performs a limited number of FEC decoding iterations, denoted as $N_{iter}$, thus yielding intermediate values of bit-wise log-likelihood ratio (LLR) values after (partial) FEC decoding. Intermediate LLR values will obey different statistics than those prior to FEC decoding, as the decoding process alters the distribution in a somewhat unpredictable way. In particular, these LLR values may no longer comprise a simple mixture of Gaussians, and particularly the so-called consistency condition $\sigma_{LLR}^2 = 2\mu_{LLR}$ is no longer true for them, where $\mu_{LLR}$ denotes de mean value, and $\sigma_{LLR}$, the variance, of the constituent Gaussians. However, at least two procedures can be devised in order to obtain the statistics of LLR:

1. Approximately infer the statistics of the LLR values on a per-block basis, by obtaining the histogram of LLR values after $N_{iter}$ FEC decoding iterations corresponding to the received block. This procedure can only be accurate enough if the block being processed involves a large number of physical resources (i.e. time-frequency resources), as happens e.g. in high-throughput systems with large user bandwidths.
2. Obtain and store an off-line record of the LLR statistics after $N_{iter}$ iterations as a function of SINR, taking advantage of the flat fading channel assumption that leads to full characterization of the channel by a single SINR. The stored characteristics of the LLR distribution can then be applied for each received SINR value. This procedure may be particularly useful when the underlying distribution is known to be simple, e.g. a mixture of Gaussians, where suitable mean/variance values (perhaps with amplitudes if there are more than two components) suffice to characterize them. In large packet systems, under not too low SINR values, this is usually the case.

Both alternatives give a more accurate result when the channel coherence bandwidth to be much larger than the user's allocated bandwidth, and the channel coherence time also much greater than the duration of the signal. In these conditions the channel experienced by the signal can be considered flat in both time and frequency. If that is not the case, statistics for the first method may not be accurate enough even in large packet systems, as channel variations will induce unpredictable LLR variations because of the non-linear nature of iterative FEC decoding. The second alternative involves a-priori knowledge of the LLR distribution after $N_{iter}$ FEC decoding iterations, as a function of SINR. In contrast with systems not using FEC, it is not straightforward how to obtain a direct relationship between SINR and the LLR distribution when SINR is not frequency-flat, because of the non-linear nature of FEC decoding process.

For the above reasons, practical systems in this invention may be restricted to flat fading channels for ease of operation, not precluding operation in non-flat fading conditions if appropriate means to infer the LLR statistics are devised. There are situations where assuming flat-fading channels is not far from reality. One example can be indoor wireless systems, where the channel coherence bandwidth is usually much larger than the user bandwidth. Flat fading may also be present in wireless systems employing beamforming. The presence of beamforming can reject most of the multipath components in wireless multipath channels, thus making the channel essentially flat in frequency (especially if beamforming is present at both sides of the communications link). Other situations with frequency-flat conditions involve narrowband communications, or in general systems for which the user bandwidth is much lower than the channel coherence bandwidth. In what follows it will be assumed that the LLR statistics after $N_{iter}$ FEC decoding iterations are known at the receiver, whatever the fading channel conditions are.

Assuming known statistics for the LLR values, and following the procedure described in EP15382344, it is possible to derive the BLER value that would characterize the decoded packet (after the required number of FEC decoding iterations for full FEC decoding, greater than $N_{iter}$), as well as the actual received BLEP value (after $N_{iter}$ iterations). To this end, we can write:

$$LLR_n^{Niter} \equiv \ln \frac{p(x_n = +1 \mid y)}{p(x_n = -1 \mid y)}, n = 0, \ldots, N-1,$$

$$BLEP_0^{Niter} = 1 - \prod_{n=0}^{N-1} \left( \frac{1}{1 + e^{-|LLR_n^{Niter}|}} \right),$$

$$BLER = BLER_{AWGN}(\gamma_{eff}),$$

where $LLR_n^{Niter}$ denotes the log-likelihood ratio of the received n-th bit after $N_{iter}$ iterations, y denotes the decoded signal after $N_{iter}$ iterations, $x_n$ is the corresponding n-th transmitted bit, N is the original number of bits of the information block (i.e. the number of bits of the block before FEC encoding), $BLEP_0^{Niter}$ is the actual received Block Error Probability (BLEP) value (after $N_{iter}$ iterations), p denotes the a posteriori probability, Π (capital pi) is the multiplication operator and $BLER_{AWGN}$ represents the BLER that would have been obtained in Additive White Gaussian Noise (AWGN) conditions for a given SINR value (after full FEC decoding), and $\gamma_{eff}$ is the effective SINR that results from the application of link to system (L2S) techniques (also called Link Abstraction Models), like Exponential Effective SINR Mapping (EESM), Capacity Effective SINR Mapping (CESM), Logarithmic Effective SINR Mapping (LESM) or Mutual Information Effective SINR Mapping (MIESM), to name a few (as is well known from the prior art; see for example "Link Abstraction Models based on Mutual Information for LTE Downlink", J. Olmos, S. Ruiz, M. Garcia-Lozano and D. Martin-Sacristan, COST 2100 TD(10)11052, 2-4 Jun. 2010, Aalborg (Denmark)).

Such techniques provide an effective SINR value that yields the same block error rate as the system has in AWGN conditions, through a suitable mapping function as for example:

$$I\left(\frac{\gamma_{\mathit{eff}}}{\alpha_1}\right) = \frac{1}{K}\sum_{k=0}^{K-1} I\left(\frac{\gamma_k}{\alpha_2}\right)$$

In the above expression $\gamma_{\mathit{eff}}$ is the effective SINR for the control part, $\gamma_k$ are the received signal to noise and interference ratios (SINR) values of the k-th channel sample that characterize the frequency response of the received channel, I is a suitable mapping function for the L2S technique, K is the number of SINR samples, and $\alpha_1, \alpha_2$ are design parameters that must be optimized for having minimum squared error between the experimental BLER and the BLER predicted by said L2S technique.

It is to note that the effective SINR is equal to the post-detection SINR in flat fading channels, therefore in this case a simple look-up table containing the mapping from SINR to BLER can suffice.

The probability density function (pdf) for BLEP after $N_{\mathit{iter}}$ iterations, denoted as $BLEP^{\mathit{Niter}}$, can be obtained by means of the following transformation of the LLR values:

$$\ln(1 - BLEP^{\mathit{Niter}}) = -\sum_{n=0}^{N-1} \ln\left(1 + e^{-|LLR_n^{\mathit{Niter}}|}\right).$$

Given that the distribution of LLR after $N_{\mathit{iter}}$ iterations is known, it will be possible to obtain the pdf of BLEP after $N_{\mathit{iter}}$ iterations as a transformation of LLR. N is the number of bits of the received block.

It is to note that the BLER value does not equate to the mean value of $BLEP^{\mathit{Niter}}$, because the obtained LLR values correspond to only $N_{\mathit{iter}}$ FEC decoding iterations (less iterations that the iterations needed to have full FEC decoding) and are thus only intermediate values. However, a useful relationship can be established between BLER and the above obtained BLEP distribution. Given that BLER represents the fraction of possible outcomes (in terms of received blocks) leading to packet errors, and since such outcomes will necessarily be part of the sample space in the obtained BLEP distribution, a decision test can be derived so as to predict whether the received block (packet) has errors or not in the following way: checking whether the probability that BLEP is above $BLEP_0$ is below the average block error rate $BLER_{AWGN}$ ($\gamma_{\mathit{eff}}$) (calculated for the set of SINR values $\gamma_n$ through the effective SINR $\gamma_{\mathit{eff}}$) and in the affirmative case the block is assumed to have errors, otherwise it is assumed to be correctly received. In other words:

$$\begin{cases} \text{if } P(BLEP^{\mathit{Niter}} > BLEP_0^{\mathit{Niter}}) < BLER & \text{then ERROR} \\ \text{else} & \text{OK} \end{cases}$$

For proper calculation of the above decision test, a decision variable Z can be constructed:

$$Z \equiv P(BLEP^{\mathit{Niter}} > BLEP_0^{\mathit{Niter}}) = \int_{BLEP_0^{\mathit{Niter}}}^1 f_{BLEP^{\mathit{Niter}}}(BLEP^{\mathit{Niter}}) dBLEP^{\mathit{Niter}},$$

where $f_{BLEP}^{\mathit{Niter}}$ denotes the pdf of $BLEP^{\mathit{Niter}}$ obtained, as stated before, as a transformation of $LLR_n^{\mathit{Niter}}$. Z represents the area under the tail of the probability density function of $BLEP^{\mathit{Niter}}$ above the point $BLEP_0^{\mathit{Niter}}$.

In another equivalent embodiment, the logarithm of the ratio of the tail area and the expected block error rate is used as an equivalent decision variable which will be compared with zero for error decisions:

$$LLR_Z \equiv \ln\frac{Z}{BLER} \Longrightarrow \begin{cases} LLR_Z > 0 \Longrightarrow & \text{OK} \\ LLR_Z < 0 \Longrightarrow & \text{ERROR} \end{cases}$$

Reliability for block error decisions may be given by the absolute magnitude $|LLR_Z|$, so $LLR_Z$ values with high absolute magnitude will lead to high reliability in the decision, while $LLR_{BlockError}$ values close to 0 will be more unreliable. According to this reliability, the system may assume that a given received block is in error unless the decision variable Z yields an "OK" with reliability $LLR_z$ being above some threshold. Other suitable criteria could also be possible depending on the tolerance of the system to detection errors, because unavoidable noise can lead to erroneous decisions when $LLR_z$ is close to 0. For example, suitable thresholds can be set above and below the point $LLR_z=0$ such that the percentage of erroneous decisions remains below a given target. Such thresholds would then define an uncertainty region inside which no reliable decisions can be made about the presence of packet errors. The lower the allowed percentage of erroneous decisions, the larger the uncertainty region will be.

The influence of the number of iterations $N_{\mathit{iter}}$ on the reliability of the overall prediction is more subtle. If the number of bit errors in the received block after $N_{\mathit{iter}}$ iterations is very high (or the number of iterations $N_{\mathit{iter}}$ is not high enough), it may happen that LLR values after $N_{\mathit{iter}}$ iterations do not resemble those after full FEC decoding, and the pdf of $BLEP^{\mathit{Niter}}$ will be strongly biased towards the upper limit. This means that most values of $BLEP^{\mathit{Niter}}$ will be equal to 1, and the system will face a lot of imprecision when trying to elucidate whether the area under the tail of the pdf above $BLEP_0^{\mathit{Niter}}$ is higher or lower than BLER. A higher number of iterations would thus have to be selected in this case.

In general, the optimum number of iterations must be chosen as a trade-off between latency of the decoding process and accuracy in block error decisions. The usual operating point in wireless cellular systems comprising retransmissions is around 10% in BLER values, although it could vary significantly when RF conditions become challenging. The number of iterations should then be optimized for a BLER range of, say, between 1% and 50% to account for different RF conditions, but any other range of interest will be valid for the purpose of the present invention.

Figure 3:
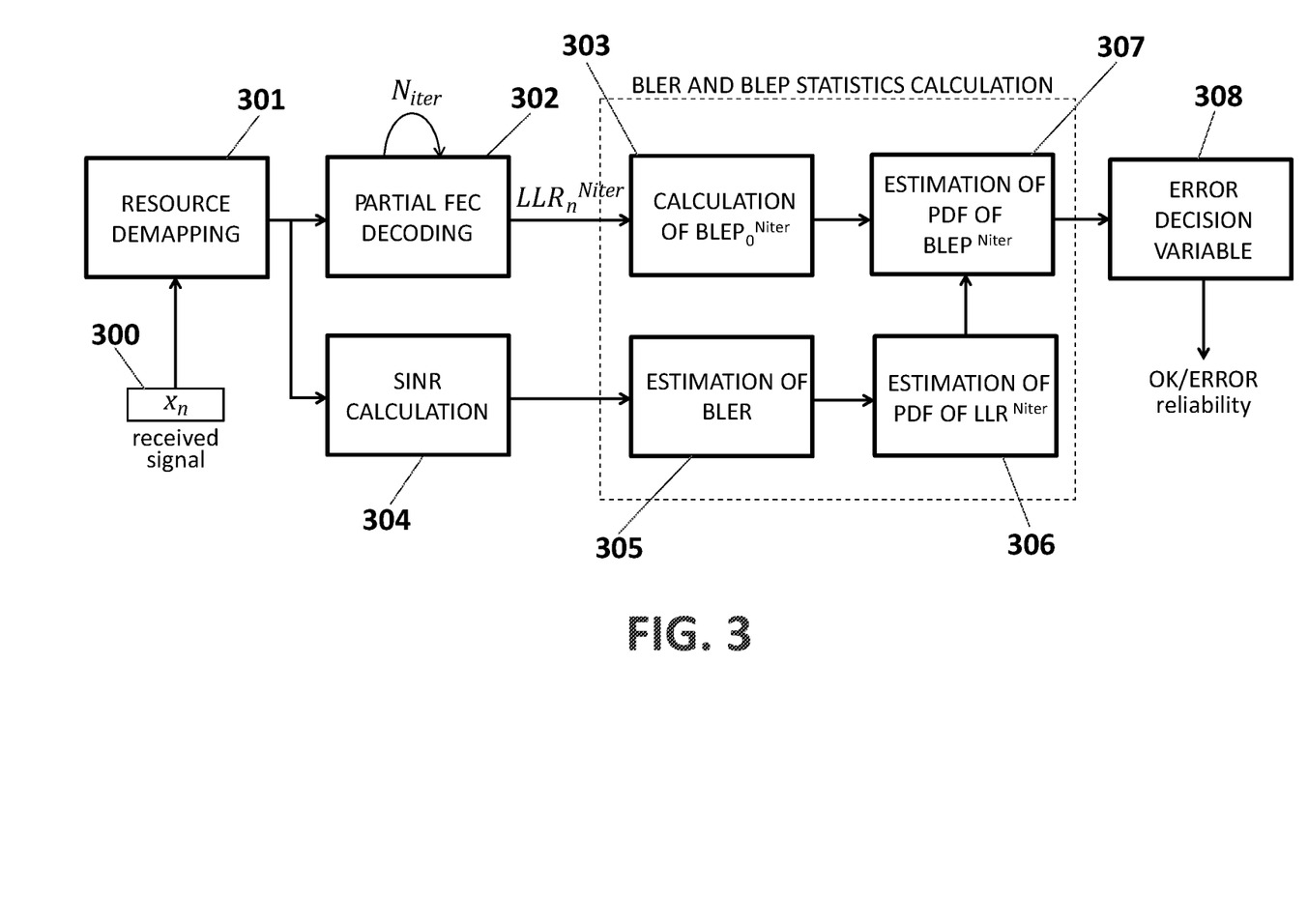
FIG. 3 shows a schematic block diagram of a receiver according to an embodiment of the invention.

FIG. 3 shows a receiver estructure according to an embodiment of the invention, depicting the general reception process for an encoded packet of size $N_{FEC}$ bits (300), according to an embodiment of the invention. The receiver first performs a resource de-mapping operation (301), which would be the inverse of block (24) at the transmit side, in order to get the received information samples (in terms of LLR values prior to decoding). Partial FEC decoding with $N_{iter}$ decoding iterations is performed in (302), thus yielding $LLR_n^{Niter}$ values (the LLR values may be obtained for example from soft output metrics of the received bits after constellation symbol detection or by any other known technique). From them, block (303) can easily obtain the value $BLEP_0^{Niter}$. Block (304) calculates the post-detection SINR characterizing the received block, and with the aid of link to system techniques, the BLER is estimated by block (305). The probability density function of $LLR_n^{Niter}$ may be also estimated by block (306) from the post-detection SINR. Block (307) then obtains an estimation of the probability density function of $BLEP^{Niter}$, and finally block (308) obtains the error decision variable that will be used to assess whether the block had errors or not, together with the associated reliability in the decision, as explained in the present invention.

Once the full process has been detailed explained, in order to clarify the invention, the process is going to be summarized according to an embodiment of the invention.

At the receiver side of the proposed OFDM communications system, a received information packet (also called information block) is partially FEC-decoded with $N_{iter}$ decoding iterations. At the same time, from the received packet the SINR is estimated as well as the value of BLER. LLR statistics after partial decoding are inferred, as well as BLEP statistics which serve as inputs for the error decision variable that is created to assess the presence of packet errors. Such error decision variable will provide indications for block errors along with the corresponding reliability of the decisions.

Summarizing, the present invention proposes a method to predict whether a received block has errors in an OFDM communications system, without having to perform full FEC decoding of the packet. The method tries to derive suitable metrics for the block error probability statistics of the received packet, based on the ones obtained by FEC decoding with a limited number of iterations. Processing time for partial FEC decoding would be lower than that of full decoding, thereby allowing for fast detection of erroneous packets.

Early detection of packet errors can be very advantageous for triggering actions at physical layer level, like MAC retransmissions, without having to wait for full packet decoding. The HARQ cycle can thus be broken in such a way that retransmissions would be decoupled from the actual delivery of the decoded packets. Breaking the HARQ cycle can be especially advantageous in CRAN deployments where tight requirements for the HARQ RTT can preclude long distances for the fronthaul links, as well as any complex processing at the transport network (such as compression, aggregation or any other processing at optical or electrical level).

The present invention can be used in any type of OFDM communication systems, especially in OFDM communication systems such as Long-Term Evolution, LTE, wireless cellular system, an IEEE 802.11, WiFi system, an IEEE 802.16, WiMAX system or any other type of OFDM communications system.

The proposed embodiments can be implemented by means of software elements, hardware elements, firmware elements, or any suitable combination of them.

Note that in this text, the term "comprises" and its derivations (such as "comprising", etc.) should not be understood in an excluding sense, that is, these terms should not be interpreted as excluding the possibility that what is described and defined may include further elements, steps, etc.

The matters defined in this detailed description are provided to assist in a comprehensive understanding of the invention. Accordingly, those of ordinary skill in the art will recognize that variation changes and modifications of the embodiments described herein can be made without departing from the scope of the invention. Also, description of well-known functions and elements are omitted for clarity and conciseness. Of course, the embodiments of the invention can be implemented in a variety of architectural platforms, operating and server systems, devices, systems, or applications. Any particular architectural layout or implementation presented herein is provided for purposes of illustration and comprehension only and is not intended to limit aspects of the invention.

The invention claimed is:

1. A method for detecting errors in an information packet (13) received by an OFDM receiver (14) in an Orthogonal Frequency-Division Multiplexing, OFDM, system, where the information packet is encoded using a Forward Error Correction, FEC, technique, said FEC technique involves at the receiver an iterative decoding process, the method characterized by comprising the following steps performed at the receiver (14):
   a) performing a number of iterations, $N_{iter}$, of the Forward Error Correction decoding technique on the received packet of length $N_{FEC}$ bits, where $N_{iter}$ is lower than the minimum number of iterations required for full FEC decoding at the intended signal to noise and interference ratio, SINR;
   b) obtaining a posteriori log-likelihood ratio, LLR, value for each decoded bit after $N_{iter}$ FEC decoding iterations;
   c) obtaining the block error probability for the block of decoded bits after $N_{iter}$ iterations, $BLEP_0^{Niter}$, and the probability density function of said block error probability, from said a posteriori LLR values;
   d) estimating a block error rate that would correspond to the received packet under full FEC decoding, based on post-detection Signal to Interference and Noise Ratios, SINR, of the received bits;
   e) obtaining a decision variable value for block error decisions, Z, as a function of the obtained block error probability $BLEP_0^{Niter}$ and the probability density function of said block error probability; and
   f) determining whether the received packet has errors or not, by comparing said decision variable with a first threshold.

2. A method according to claim 1, where the LLR values for the decoded bits after $N_{iter}$ FEC decoding iterations are defined as:

$$LLR_n^{Niter} \equiv \ln\frac{p(x_n = +1 \mid y)}{p(x_n = -1 \mid y)}, n = 0, \ldots, N-1,$$

where $LLR_n^{Niter}$ denotes the a-posteriori log-likelihood ratio of the received n-th bit after $N_{iter}$ iterations, y denotes the decoded signal after $N_{iter}$ iterations, $x_n$ is the corresponding n-th transmitted bit, and N is defined by the expression $N=r \cdot N_{FEC}$, where r is the FEC encoding rate.

3. A method according to claim 1, wherein the block error probability after $N_{iter}$ iterations, $BLEP_0^{Niter}$, is obtained by the expression:

$$BLEP_0^{Niter} = 1 - \prod_{n=0}^{N-1}\left(\frac{1}{1+e^{-|LLR_n^{Niter}|}}\right),$$

where $LLR_n^{Niter}$ is the log-likelihood ratio of the received n-th bit after $N_{iter}$ iterations, and N is defined by the expression $N=r \cdot N_{FEC}$, where r is the FEC encoding rate.

4. A method according to claim 1, wherein the probability density function of said block error probability after $N_{iter}$ iterations, $BLEP^{Niter}$, is calculated as a function of the probability density function of the LLR values, $LLR_n^{Niter}$, by using the following transformation:

$$\ln(1 - BLEP^{Niter}) = -\sum_{n=0}^{N-1} \ln\left(1 + e^{-|LLR_n^{Niter}|}\right),$$

where N is defined by the expression $N=r \cdot N_{FEC}$, where r is the FEC encoding rate.

5. A method according to claim 1, wherein estimating a block error rate that would correspond to the received packet under full FEC decoding, comprises:
   obtaining post-detection Signal to Interference and Noise Ratio, SINR, values characterizing the received signal prior to FEC decoding;
   from said post-detection SINR values, calculating an effective SINR by means of a Link to System technique; and
   calculating the block error rate that would be obtained if the communication channel would have been an Additive White Gaussian Noise Channel for the effective SINR value calculated.

6. A method according to claim 1, wherein the decision variable is the probability that the block error probability after $N_{iter}$ iterations is higher than $BLEP_0^{Niter}$.

7. A method according to claim 1, wherein the first threshold is the estimated block error rate.

8. A method according to claim 1, wherein the decision variable Z is calculated as:

$$Z = \int_{BLEP_0^{Niter}}^{1} f_{BLEP^{Niter}}(BLEP^{Niter}) dBLEP^{Niter},$$

where $f_{BLEP}^{Niter}$ denotes the probability density function of $BLEP^{Niter}$ obtained as a transformation of the a posteriori LLR values, and $BLEP_0^{Niter}$ is the block error probability of the received packet after $N_{iter}$ iterations.

9. A method according to claim 1, wherein the method further comprises calculating the reliability in said estimation of block errors as a log-likelihood ratio value, $LLR_z$, obtained as the logarithm of the ratio between the decision variable and the block error rate.

10. A method according to claim 9, wherein uncertainty regions are defined for $LLR_z$, where error decisions are made only when $LLR_z$ values fall outside said uncertainty region.

11. A method according to claim 1, wherein statistics of the LLR values for the decoded bits after $N_{iter}$ FEC decoding iterations are estimated by obtaining the histogram of LLR values corresponding to the received packet, provided that the channel coherence bandwidth is much larger than the bandwidth occupied by the signal.

12. A method according to claim 1, wherein statistics of the LLR values for the decoded bits after $N_{iter}$ FEC decoding iterations are previously stored at the receiver as a function of the received SINR value, in Additive White Gaussian Noise conditions, provided that the channel coherence bandwidth is much larger than the bandwidth occupied by the signal.

13. A method according to claim 1, wherein the number of decoding iterations $N_{iter}$ is selected as a trade-off between latency of the decoding process and accuracy of block error decisions in the operating BLER range.

14. An OFDM receiver (14) for detecting errors in an information packet (13) received through a communication channel (12) of an OFDM network, where the information packet is encoded using a Forward Error Correction, FEC, technique, said FEC technique involving at the receiver an iterative decoding process, the receiver (14) comprising:
   A decoder for performing a number of iterations, $N_{iter}$, of the Forward Error Correction decoding technique on the received packet of length $N_{FEC}$ bits, where $N_{iter}$ is lower than the minimum number of iterations required for full FEC decoding at the intended signal to noise and interference ratio, SINR;
   Means for:
      Obtaining a posteriori log-likelihood ratio, LLR, values for each decoded bit after $N_{iter}$ FEC decoding iterations;
      Obtaining the block error probability for the block of decoded bits after $N_{iter}$ iterations, $BLEP_0^{Niter}$, and the probability density function of said block error probability, from said a posteriori LLR values;
      Estimating a block error rate that would correspond to the received block under full FEC decoding, based on post-detection Signal to Interference and Noise Ratios, SINR, of the received bits;
      Obtaining a decision variable value for block error decisions, Z, as a function of the block error probability $BLEP_0^{Niter}$ and the probability density function of said block error probability; and
      Determining whether the packet has errors or not, by comparing said decision variable with a first threshold.

15. A system for detecting errors in an information block (13) in an OFDM system comprising an OFDM receiver (14) according to claim 14 and an OFDM transmitter (10), connected through an OFDM communications channel (12) with the OFDM receiver (14).

* * * * *